United States Patent
Filippi et al.

(10) Patent No.: US 8,889,491 B2
(45) Date of Patent: Nov. 18, 2014

(54) METHOD OF FORMING ELECTRONIC FUSE LINE WITH MODIFIED CAP

(71) Applicant: International Business Machines Corporation, Armonk, NY (US)

(72) Inventors: Ronald G. Filippi, Wappingers Falls, NY (US); John A. Fitzsimmons, Poughkeepsie, NY (US); Erdem Kaltalioglu, Newburgh, NY (US); Ping-Chuan Wang, Hopewell Junction, NY (US); Lijuan Zhang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/751,238

(22) Filed: Jan. 28, 2013

(65) Prior Publication Data

US 2014/0210040 A1 Jul. 31, 2014

(51) Int. Cl.
*H01L 21/82* (2006.01)
*H01L 23/48* (2006.01)

(52) U.S. Cl.
USPC ............ 438/132; 438/215; 438/281; 438/602; 257/758; 257/759

(58) Field of Classification Search
USPC ......... 438/129, 132, 215, 281, 333, 467, 601, 438/E21.592; 257/127, 170, 209, 211, 265, 257/758–760, E21.575, E21.577; 219/121.6–121.7, 124.78
See application file for complete search history.

(56) References Cited

U.S. PATENT DOCUMENTS

| | | | |
|---|---|---|---|
| 6,078,091 A * | 6/2000 | MacPherson et al. | 257/529 |
| 7,323,781 B2 | 1/2008 | Noguchi et al. | |
| 7,480,990 B2 | 1/2009 | Fitzsimmons et al. | |
| 7,651,893 B2 | 1/2010 | Chen et al. | |
| 7,820,493 B1 * | 10/2010 | Cheng et al. | 438/132 |
| 7,851,885 B2 | 12/2010 | Kim et al. | |
| 7,956,466 B2 * | 6/2011 | Hsu et al. | 257/758 |
| 8,133,767 B2 * | 3/2012 | Yang et al. | 438/132 |
| 2008/0157270 A1 | 7/2008 | Kim et al. | |
| 2008/0258255 A1 | 10/2008 | Ker et al. | |
| 2011/0012629 A1 | 1/2011 | Chakravarti et al. | |
| 2011/0169127 A1 | 7/2011 | Hsu et al. | |

* cited by examiner

*Primary Examiner* — Dung A. Le
(74) *Attorney, Agent, or Firm* — Catherine Ivers; L. Jeffrey Kelly

(57) ABSTRACT

An electronic fuse structure having an $M_x$ level including an $M_x$ dielectric, a fuse line, an $M_x$ cap dielectric above at least a portion of the $M_x$ dielectric, and a modified portion of the $M_x$ cap dielectric directly above at least a portion of the fuse line, where the modified portion of the $M_x$ cap dielectric is chemically different from the remainder of the $M_x$ cap dielectric, an $M_{x+1}$ level including an $M_{x+1}$ dielectric, a first $M_{x+1}$ metal, an $M_{x+1}$ cap dielectric above of the $M_{x+1}$ dielectric and the first $M_{x+1}$ metal, where the $M_{x+1}$ level is above the $M_x$ level, and a first via electrically connecting the fuse line to the first $M_{x+1}$ metal.

8 Claims, 6 Drawing Sheets

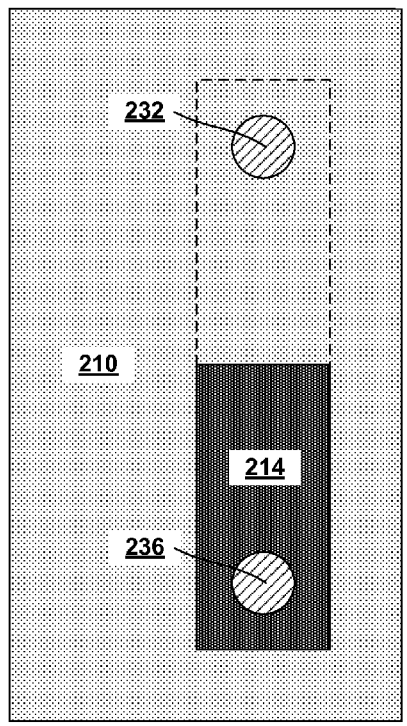
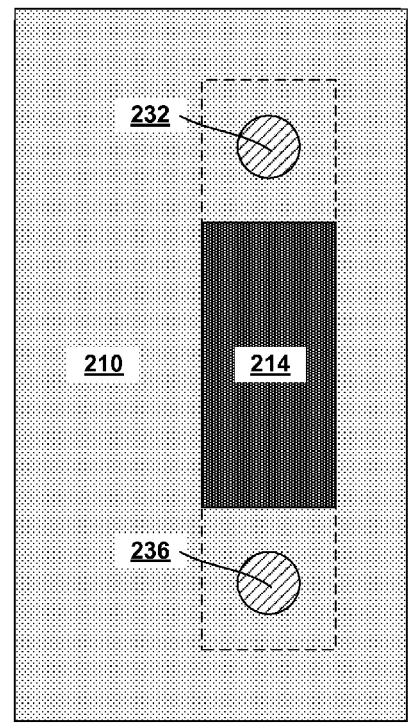
FIG. 7          FIG. 8
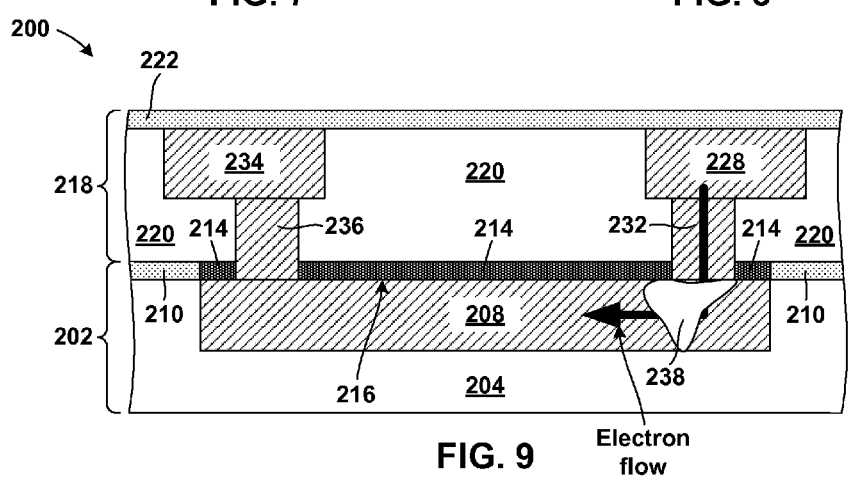
FIG. 9

METHOD OF FORMING ELECTRONIC FUSE LINE WITH MODIFIED CAP

BACKGROUND

1. Field of the Invention

The present invention relates generally to semiconductors, and, more particularly, to electronic fuse interconnect structures.

2. Background of Invention

A fuse is a structure that is blown in accordance with a suitable electrical current. For example, an electrical current is provided through the fuse to eventually cause the fuse to blow and create an open circuit. Programming refers to intentionally blowing a fuse and creating the open circuit. In integrated circuitry memory devices, fuses can be used for activating redundancy in memory chips and for programming functions and codes in logic chips. Specifically, dynamic random access memory (DRAM) and static random access memory (SRAM) may employ fuses for such purposes.

Electronic fuses (e-fuses) can also be used to prevent decreased chip yield caused by random defects generated in the manufacturing process. Moreover, e-fuses provide for future customization of a standardized chip design. For example, e-fuses may provide for a variety of voltage options, packaging pin out options, or any other options desired by the manufacturer to be employed prior to the final processing. These customization possibilities make it easier to use one basic design for several different end products and help increase chip yield.

Some e-fuses take advantage of electromigration effects to blow and create the open circuit. For example, electromigration can be defined as the transport of material caused by the gradual movement of ions in a conductor due to the momentum transfer between conducting electrons and diffusing metal atoms. In e-fuses that take advantage of electromigration effect, such transport of material caused by the gradual movement of ions can produce voids which cause the e-fuse to blow and create the open circuit.

However, in a typical e-fuse electromigration may cause unpredictable voids, thus potentially creating the open circuit in undesirable locations. Furthermore, typical e-fuse programming may require high programming currents and long programming times. Such programming currents and times may result in unpredictable void formation during programming which may negatively affect other circuits adjacent to the e-fuse. Therefore, it may be desirable to program an e-fuse with reduced programming currents and reduced programming time. In addition, predictable and repeatable void formation may also be preferred.

Accordingly, there exists a need in the art to overcome the deficiencies and limitations described hereinabove.

SUMMARY

According to one embodiment of the present invention, an electronic fuse structure is provided. The electronic fuse structure may include an $M_x$ level including an $M_x$ dielectric, a fuse line, an $M_x$ cap dielectric above at least a portion of the $M_x$ dielectric, and a modified portion of the $M_x$ cap dielectric directly above at least a portion of the fuse line, where the modified portion of the $M_x$ cap dielectric is chemically different from the remainder of the $M_x$ cap dielectric, an $M_{x+1}$ level including an $M_{x+1}$ dielectric, a first $M_{x+1}$ metal, an $M_{x+1}$ cap dielectric above of the $M_{x+1}$ dielectric and the first $M_{x+1}$ metal, where the $M_{x+1}$ level is above the $M_x$ level, and a first via electrically connecting the fuse line to the first $M_{x+1}$ metal.

According another exemplary embodiment, a method of forming an electronic fuse is provided. The method may include forming an $M_x$ level including a fuse line, an $M_x$ dielectric, and an $M_x$ cap dielectric above of the fuse line and the $M_x$ dielectric, modifying a portion of the $M_x$ cap dielectric directly above the fuse line, and forming an $M_{x+1}$ level above the $M_x$ level, the $M_{x+1}$ level including a first $M_{x+1}$ metal and a first via electrically connecting the fuse line to the first $M_{x+1}$ metal.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which:

FIG. 2 depicts an $M_x$ level having an $M_x$ metal, a fuse line, and an $M_x$ cap dielectric according to an exemplary embodiment.

FIG. 3 depicts the $M_x$ cap dielectric located directly above the fuse line after a post-treatment process according to an exemplary embodiment.

FIG. 4 depicts the final e-fuse structure according to an exemplary embodiment.

FIG. 7 depicts a cross section view, section B-B, of FIG. 4, according to another exemplary embodiment.

FIG. 8 depicts a cross section view, section B-B, of FIG. 4, according to another exemplary embodiment.

FIG. 9 depicts the cross section view, section A-A, of FIG. 4, after programming the e-fuse according to one embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
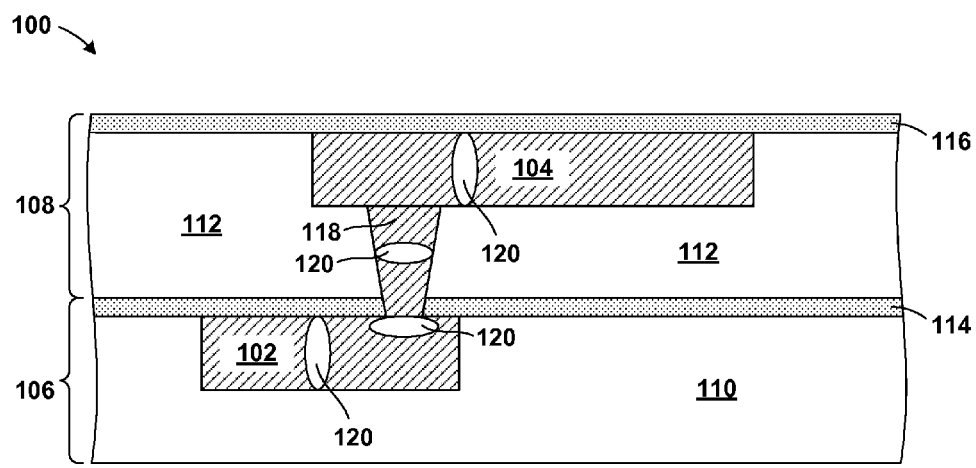
FIG. 1 depicts a cross-sectional view of a vertical e-fuse after programming according to the prior art.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The invention relates generally to an e-fuse structure, and more particularly, to an e-fuse structure containing a modified capping layer. The e-fuse structure may include a fuse line having a modified capping layer, in which a post-treatment process may be applied directly above the fuse line to induce desired interfacial properties between the fuse line and the capping layer. The desired interfacial properties may be unique to the fuse line and different from other metal-dielectric interfaces in the structure. The desired interfacial properties may provide for decreased electromigration resistance and the promotion of void formation at the interface between the fuse line and the capping layer. Any configuration of vias located at either end of the fuse line may form the connection to and from the fuse line and the surrounding circuitry. For example, the fuse line may be connected by two vias, both above the fuse line, both below the fuse line, or one via above the fuse line and one via below the fuse line.

Advantageously, the formation of the e-fuse structure of the present invention can be implemented in the back-end-of-line (BEOL), and is compatible with current process flows. The BEOL may be distinguished from FEOL in that semiconductor devices, for example transistors, may be fabricated in the FEOL while the connections to and between those semiconductor devices may be formed in the BEOL. The present invention thus allows the e-fuse to be fabricated during normal interconnect process flows, thus advantageously reducing processing costs for manufacturing e-fuses which are normally fabricated in different process flows.

More specifically, multilayer electronic components include multiple layers of a dielectric material having metallization on each layer in the form of vias, pads, straps connecting pads to vias, and wiring. Vias or other openings in the dielectric layer extend from one layer to another layer. These openings are filled with a conductive material and electrically connect the metallization of one layer to the metallization of another layer and provide for the high density electronic component devices now used in industry. The metallization of each dielectric layer may be formed using a filling technique such as electroplating, electroless plating, chemical vapor deposition, physical vapor deposition or a combination of methods. The metallization and dielectric layer may be capped with a cap dielectric, which may be, for example, a silicon nitride, or a silicon carbon nitride ($SiC_xN_yH_z$) such as N-Blok. In the present case, the metallization of a particular dielectric layer, in a particular region, may be referred to as a fuse line as will be described in detail below.

By way of example FIG. 1 illustrates a structure 100 having a typical e-fuse structure in which the electromigration failure mode of the e-fuse structure after programming is depicted. The e-fuse may include an $M_x$ level 106, an $M_{x+1}$ level 108, and a via 118. The $M_x$ level 106 may include an $M_x$ dielectric 110 and an $M_x$ metal 102. The $M_{x+1}$ level 108 may include an $M_{x+1}$ dielectric 112 and an $M_{x+1}$ metal 104. An $M_x$ cap dielectric 114 may be located between the $M_x$ dielectric 110 and the $M_{x+1}$ dielectric 112 and electrically insulate the $M_x$ metal 102 from the $M_{x+1}$ metal 104. An $M_{x+1}$ cap dielectric 116 may be located above the $M_{x+1}$ dielectric 112 and electrically insulate the $M_{x+1}$ metal 104 layer from additional interconnect levels (not shown) that may be subsequently formed above.

The via 118 electrically connects the $M_x$ metal 102 to the $M_{x+1}$ metal 104. The $M_x$ metal 102, the $M_{x+1}$ metal 104, and the via 118 make up the typical e-fuse. The e-fuse is a structure that may be blown in accordance with the application of a suitable electrical current. For example, an electrical current may be provided through the e-fuse to eventually cause the e-fuse to blow and create an open circuit. Programming refers to blowing an e-fuse and creating the open circuit. A suitable electrical current depends on the e-fuse design and may range from about 10 mA to about 25 mA, and ranges there between. Alternatively, programming may occur at a threshold current density. For example, a typical current density of 100 $mA/cm^2$ may be required to program the e-fuse. Additionally, a circuit is considered to be programmed, and open, when the e-fuse resistance increases more than an order of magnitude over the initial pre-programmed resistance of the e-fuse. During programming of the e-fuse, one or more voids 120 may form in unexpected locations due to non-optimized processing. Location of the voids 120 may be uncontrollable and may affect the yield and reliability of the e-fuse. The voids 120 are due in part to the electromigration of conductive interconnect material within the e-fuse. For example, one void 120 may be located in the $M_x$ metal 102 and cause the e-fuse to blow at the $M_x$ metal 102. Therefore, an open circuit is formed at the $M_x$ metal 102 during programming. An open circuit may be the desired result of programming the e-fuse, however, an open circuit in the $M_x$ metal 102 may affect other circuits (not shown) that may be connected to the a $M_x$ metal 102. It should be noted that multiple voids are depicted as illustrative examples, and depending on the direction of the current, the voids 120 may form in the $M_x$ metal 102, the via 118, or the $M_{x+1}$ metal 104.

Ideally programming will cause only the targeted e-fuse to blow while maintaining the integrity of all surrounding circuits. One way to ensure the open circuit caused by programming only causes the targeted e-fuse to blow may be to induce void formation with lower programming currents and create an open circuit to occur within a designated region or area. One exemplary embodiment by which to ensure that only the targeted e-fuse is affected by programming is described in detail below by referring to the accompanying drawings FIGS. 2-4. In the present embodiment, a capping layer above a fuse link may be modified to induce differential interfacial properties between the capping layer and the fuse link.

Figure 2:
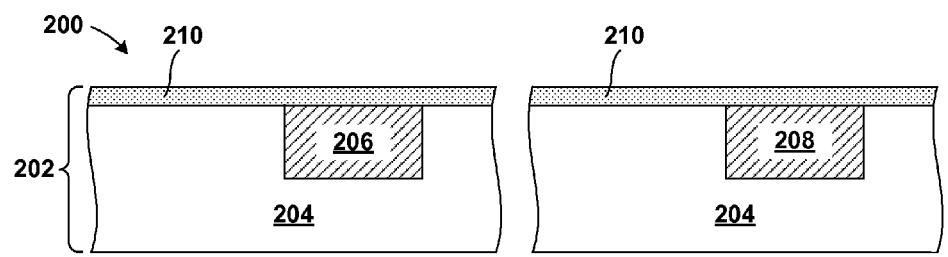
FIGS. 2-4 illustrate the steps of a method of forming a vertical e-fuse according to an exemplary embodiment.

Referring now to FIG. 2, a structure 200 is shown. The structure 200 may include an $M_x$ level 202. The $M_x$ level 202 may include an $M_x$ dielectric 204, an $M_x$ metal 206, a fuse line 208, and an $M_x$ cap dielectric 210. It should be noted that the fuse line 208 may be substantially similar to the $M_x$ metal 206; however the fuse line 208 may be incorporated into a fuse circuit only. The fuse circuit may serve no other purpose than to function as a fuse. In other words, connections made to the fuse line 208 may be for the sole purpose of forming the fuse circuit. The $M_x$ level 202 may be any interconnect level in the structure 200. It should be noted that while only a single interconnect level is shown, the structure 200 may have multiple interconnect levels above and below the $M_x$ level 202. It should be noted that the left side of FIG. 2 is intended to depict a non-fuse region of the structure 200, and the right side of FIG. 2 is intended to depict a fuse region of the structure 200.

The $M_x$ metal 206 and the fuse line 208 may be formed in the $M_x$ dielectric 204 in accordance with typical lithographic techniques. The $M_x$ metal 206 may consist of a typical line or wire found in a typical semiconductor circuit and the fuse line 208 may consist of a line or wire which will form the base structure for an e-fuse. The $M_x$ metal 206 and the fuse line 208 may be substantially similar structures and may be fabricated using, for example, a typical single or dual damascene technique in which a conductive interconnect material may be deposited in a trench formed in the $M_x$ dielectric 204. In one embodiment, the $M_x$ metal 206 and the fuse line 208 may include various barrier liners (not shown). One barrier liner may include, for example, tantalum nitride (TaN), followed by an additional layer including tantalum (Ta). Other barrier liners may include cobalt (Co), or ruthenium (Ru) either alone or in combination with any other suitable liner. The conductive interconnect material may include, for example, copper (Cu), aluminum (Al), or tungsten (W). The conductive interconnect material may be formed using a filling technique such as electroplating, electroless plating, chemical vapor deposition, physical vapor deposition or a combination of methods. The conductive interconnect material may alternatively include a dopant, such as, for example, manganese (Mn), magnesium (Mg), copper (Cu), aluminum (Al) or other known dopants. A seed layer (not shown) may optionally be deposited using a technique such as physical vapor deposition, atomic layer deposition, plasma enhanced atomic layer deposition, plasma enhanced chemical vapor deposition, or chemical vapor deposition process prior to filling the trench. The seed layer may also include similar dopants as the conductive interconnect material.

With continued reference to FIG. 2, the $M_x$ cap dielectric 210 may be deposited over the structure 200. The $M_x$ cap dielectric 210 may electrically insulate the $M_x$ level 202 from additional interconnect levels (not shown) that may be subsequently formed above the $M_x$ level 202. The $M_x$ cap dielectric 210 may be deposited using typical deposition techniques, for example, chemical vapor deposition. The $M_x$ cap dielectric 210 may include any suitable dielectric material, for example, silicon nitride (SiN), hydrogenated silicon nitride (SiNH), silicon carbide (SiC), silicon carbon nitride (SiCN), hydrogenated silicon carbon (SiCH), hydrogenated silicon carbon nitride (SiCNH), or other known capping materials. The $M_x$ cap dielectric 210 may have a thickness ranging from about 20 nm to about 60 nm and ranges there between, although a thickness less than 20 nm and greater than 60 nm may be acceptable.

Typically, a surface of the $M_x$ dielectric 204 and the $M_x$ metal 206 and the fuse line 208 may undergo a pre-treatment process prior to the deposition of the $M_x$ cap dielectric 210. The pre-treatment process may be designed to enhance electromigration resistance and decrease void formation along an interface between the $M_x$ metals and the cap dielectric. More specifically, the pre-treatment process may be designed to reduce metal surface oxides to produce a bulk uniform metal layer prior to dielectric cap deposition. Additionally, the pre-treatment process may also produce a pre-bonding layer on the surface of the $M_x$ metal 206 and the fuse line 208 designed to further promote enhanced adhesion between the $M_x$ metal 206 and the fuse line 208, and the $M_x$ cap dielectric 210. The typical pre-treatment process may encourage the formation of a nitrogen-silicon interface bonding structure that may interact with the $M_x$ cap dielectric 210 to produce an enhanced metal-dielectric bond. Void formation in the metallization of any interconnect level is typically undesirable and may affect reliability and performance of the final structure. However, in the present embodiment, void formation may be customary when an e-fuse is programmed.

Figure 3:
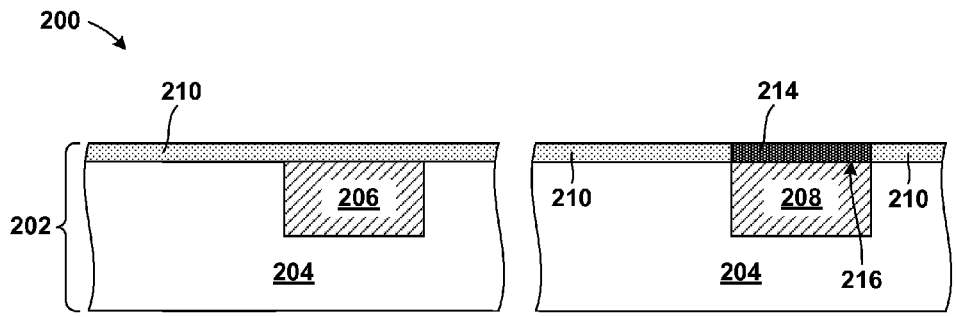

Referring now to FIG. 3, unlike the typical process described above, a post cap dielectric treatment process (herein "post-treatment" process) may be applied after the deposition of the $M_x$ cap dielectric 210. The post-treatment process may be designed to decrease any benefits of the typical pre-treatment process described above. The post-treatment process may be applied to a portion of the $M_x$ cap dielectric 210 directly above the fuse line 208. For example, known lithography and masking techniques may be used to ensure only the intended portion above the fuse line 208 is treated during the post-treatment process. In one embodiment, the treated portion may include the entire portion of the $M_x$ cap dielectric 210 directly above the fuse line 208, for example see FIG. 6. In another embodiment, the treated portion may include some portion less than the entire portion of the $M_x$ cap dielectric 210 directly above the fuse line 208 for example see FIGS. 7 and 8. In one embodiment, not shown, the treated portion of the $M_x$ cap dielectric 210 may extend beyond the perimeter of the fuse line 208 above the $M_x$ dielectric 204. The treated portion of the $M_x$ cap dielectric 210 may be referred to as a modified portion of the $M_x$ cap dielectric 214 (hereinafter "modified fuse cap" 214). It should be noted that the modified fuse cap 214 may be located in the fuse regions and not in the non-fuse regions of the structure 200.

The post-treatment process may include any suitable oxidizing technique known in the art. In one embodiment, the modified fuse cap 214 may be formed using a high density oxygen containing plasma technique in which the exposed surface may be treated with an oxidizing plasma designed to penetrate the exposed layer of the $M_x$ cap dielectric 210 to an interface 216 between the modified fuse cap 214 and the fuse line 208, and introduce elements such as oxygen. In one embodiment, a plasma treatment with a mixture that contains an oxygen containing compound such as, but not limited to, $O_2$, CO, $CO_2$, $H_2O$, $CH_3OH$, $ROH(CH_3)_2O$, $R_1R_2O$ (where R, $R_1$, and $R_2$ represent carbon containing species such as $CH3CH_2$—) may be used. The introduction of oxygen may reduce the electromigration resistance and encourage the movement of conductive interconnect material along the interface 216. Formation of the modified fuse cap 214 may in turn encourage the formation of voids within a predictable area, for example, the fuse line 208, thereby improving functionality and reliability of the resulting e-fuse structure. It should be noted that the modified fuse cap 214 may be chemically different from the $M_x$ cap dielectric 210; however the modified fuse cap 214 may have the same elements as the $M_x$ cap dielectric 210 with the addition of oxygen.

The desired objective of the post-treatment process, and more specifically the oxidation technique, is to introduce oxygen adjacent the interface 216. Thus, the post-treatment process may oxidize the dielectric cap 210 or both the dielectric cap 210 and an underlying portion of the fuse line 208. Preferably, an oxygen-metal bond is formed at the interface 216. Typical conditions to produce this desired bond may vary depending on the thickness of the portion of the $M_x$ cap dielectric 210 and the oxygen containing species. Alternately, other techniques such as ion implantation or gas cluster ion treatments or a wets process may also be used to produce this same desired result.

Alternatively, in one embodiment, the pre-treatment process described above may be foregone and only the post-treatment process may be applied after the deposition of the $M_x$ cap dielectric 210.

In one embodiment, in which a copper manganese (CuMn) seed layer is deposited during the formation of the fuse line 208, as described above, oxidizing the $M_x$ capping dielectric 210 during the post-treatment process may further oxidize the manganese (Mn) which has migrated to the top of the fuse line 208 during its formation. The manganese may be included in the seed layer to help protect the conductive interconnect material from any degradation due to subsequent oxidation. Using the post-treatment process to purposefully oxidize the cap dielectric and the interface, may in turn oxidize significant amounts of the available manganese which may allow the conductive interconnect material to oxidize. The oxidation of the conductive interconnect material may therefore include the desired metal-oxygen bond, for example a copper-oxygen bond.

Figure 4:
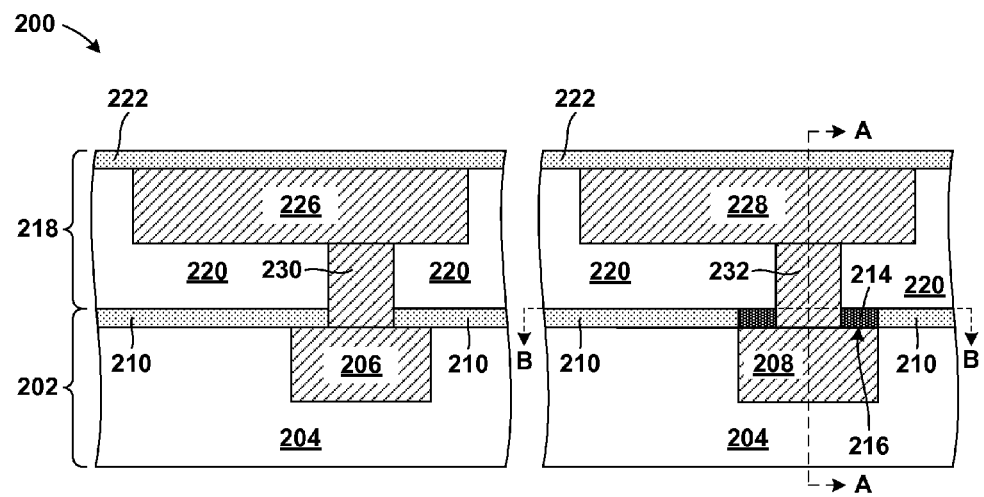

Referring now to FIG. 4, an $M_{x+1}$ level 218 located above the $M_x$ level 202 is shown. The $M_{x+1}$ level 218 may include an $M_{x+1}$ dielectric 220, a first $M_{x+1}$ metal 226, and a second $M_{x+1}$ metal 228. It should be noted that while only two interconnect levels are shown, the structure 200 may have multiple interconnect levels above the $M_{x+1}$ level 218 and below the $M_x$ level 202. The first $M_{x+1}$ metal 226, and the second $M_{x+1}$ metal 228 may be substantially similar to the $M_x$ metal 206, and the fuse line 208, as described above. Also, The $M_{x+1}$ dielectric 220 may be substantially similar to the $M_x$ dielectric 204, as described above.

Vias, generally, may be used to form electrical connections between the metallization of two interconnect levels. The $M_{x+1}$ level 218 may further include a first via 230, and a second via 232. The first via 230 may extend vertically and form a conductive link between the $M_x$ metal 206 and the first $M_{x+1}$ metal 226. The second via 232 may also extend vertically and form a conductive link between the fuse line 208 and the second $M_{x+1}$ metal 228. The first and second vias 230, 232 may typically be formed concurrent with the first and second $M_{x+1}$ metals 226, 228. For example, the $M_{x+1}$ metal 226 and the via 230 may be fabricated using a typical dual damascene technique in which a conductive interconnect material may be deposited in a via and a trench formed in the $M_{x+1}$ dielectric 220. Like the $M_x$ metal 206, the first and second $M_{x+1}$ metals 226, 228, and the first and second vias 230, 232 may also include various barrier liners, as described above. The $M_{x+1}$ level 218 may further include a third $M_{x+1}$ metal 234 and a third via 236, shown in a cross section view, section A-A, shown in FIG. 5.

Figure 5:
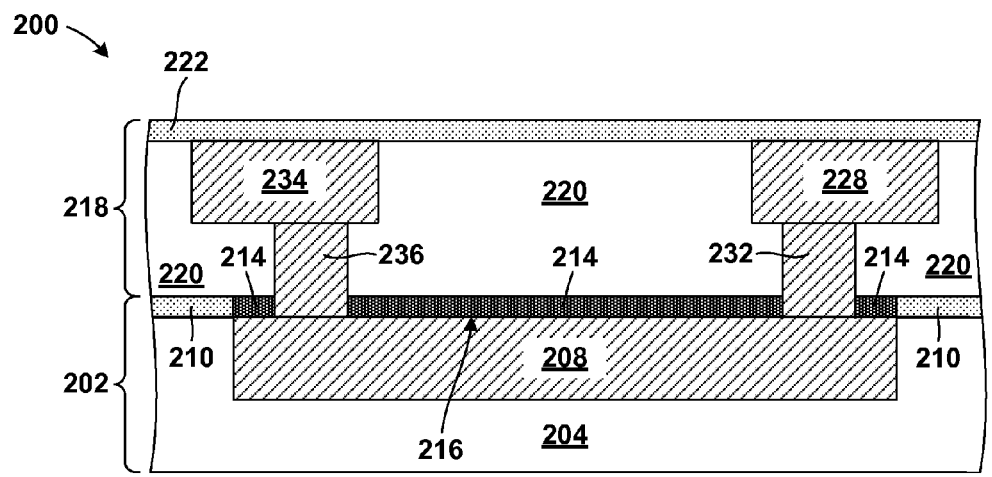
FIG. 5 depicts a cross section view, section A-A, of FIG. 4.

Referring now to FIG. 5, the third $M_{x+1}$ metal 234 and the third via 236 are shown. Like above, the third via 236 may typically be formed concurrent with the third $M_{x+1}$ metal 234, using a typical dual damascene technique. The third $M_x$ metal 234 and the third via 236 may also include various barrier liners (not shown), and an optional seed layer, as described above.

As shown in the figure, the second via 232 may extend vertically and form a conductive link between one end of the fuse line 208 and the second $M_{x+1}$ metal 228 while the third via 236 may extend vertically and form a conductive link between an opposite end of the fuse line 208 and the third $M_{x+1}$ metal 234. The first, second, and third vias 230, 232, 236 may have an aspect ratio of about 4:1 or more or less, and a diameter or width ranging from about 20 nm to about 100 nm and ranges there between, although a via diameter less than 20 nm and greater than 100 nm may be acceptable. Those skilled in the art will recognize that via diameters will change depending upon the metal level and scale as technology nodes continue to shrink.

With continued reference to FIGS. 4 and 5, the final e-fuse structure is shown. As previously described, the left side of FIG. 4 represents the non-fuse region of the structure 200, while the right side of FIG. 4 represents the fuse region of the structure 200. Similarly, the cross section view depicted in FIG. 5 depicts the fuse region of the structure 200. Therefore, the second $M_{x+1}$ metal 228, the second via 232, the fuse line 208, the third via 236, and the third $M_{x+1}$ metal 234 may together form the final e-fuse structure. The e-fuse structure may further include the modified fuse cap 214 positioned directly above the fuse line 208 thereby causing the interface 216 to be weakened, as described in detail above. It should be noted that the modified fuse cap 214 is not present in the non-fuse regions of the structure 200.

Figure 6:
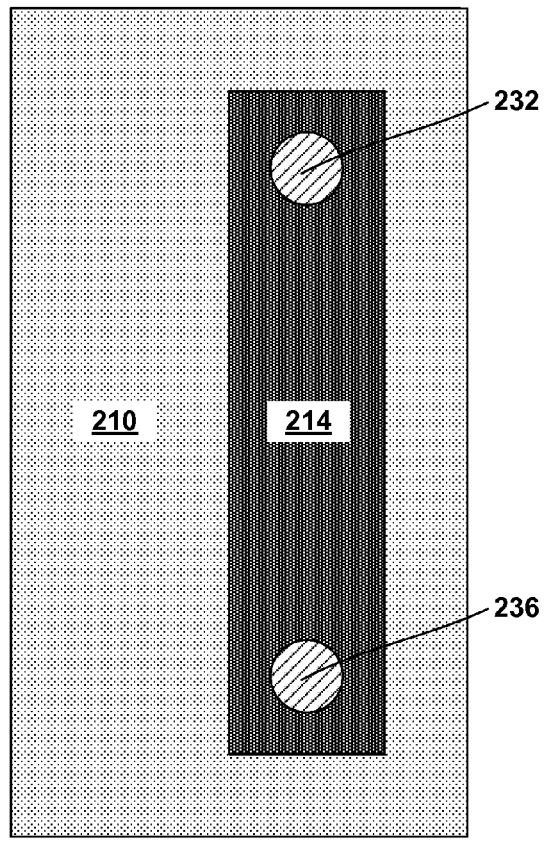
FIG. 6 depicts a cross section view, section B-B, of FIG. 4.

Now referring to FIG. 6, a cross section view of FIG. 4, section B-B, is provided. Section B-B depicts the portion of the $M_x$ cap dielectric 210 modified by the post-treatment process. In the present embodiment, the entire portion of the $M_x$ cap dielectric 210 directly above the fuse line 208 is modified during the post-treatment process. Alternative embodiments are depicted in FIGS. 7 and 8.

Now referring to FIGS. 7 and 8, a cross section view of FIG. 4, section B-B, is provided, and alternative embodiments are shown. In both figures only a portion of the $M_x$ cap dielectric 210 directly above the fuse line 208 is modified during the post-treatment process. In one embodiment, the modified portion may be located at one end of the fuse line 208, see FIG. 7. In another embodiment, the modified portion may be located at or near the middle of the fuse line 208, see FIG. 8.

Now referring to FIG. 9, the final vertical e-fuse structure is shown after programming. Decreased electromigration resistance of the e-fuse at the interface 216 between the fuse line 208 and the modified fuse cap 214 may result in the formation and propagation of a void 238. The oxygen bonding introduced at or adjacent the interface 216 may decrease the bonding between the $M_x$ cap dielectric 210 and the fuse line 208, and allow for movement of the conductive interconnect material at the interface 216. For example, the conductive interconnect material of the fuse line 208 may move or migrate due to a thermodynamically lower energy state which may result in the production of voids in the conductive interconnect material. Voids may form because of the movement of atoms away from areas of higher energy to areas of lower energy. In the present embodiment, in which the electrons are flowing in the direction indicated in the figure, the void 238 may generally be located near the second via 232. This may be caused by an increase in current density and heat in the general area near the via. The void 238 may begin to grow from the interface 216 as the conductive interconnect material migrates in the direction of the current. This configuration may provide more consistency and reliability during programming of the e-fuse because the void 238, or open circuit, may occur at lower programming currents and shorter programming times. The lower programming currents and shorter programming times may be achieved by the introduction of oxygen at the interface 216 during the post-treatment process. The post-treatment process may therefore improve electromigration, and thereby encouraging faster e-fuse programming at lower currents.

Figure 10:
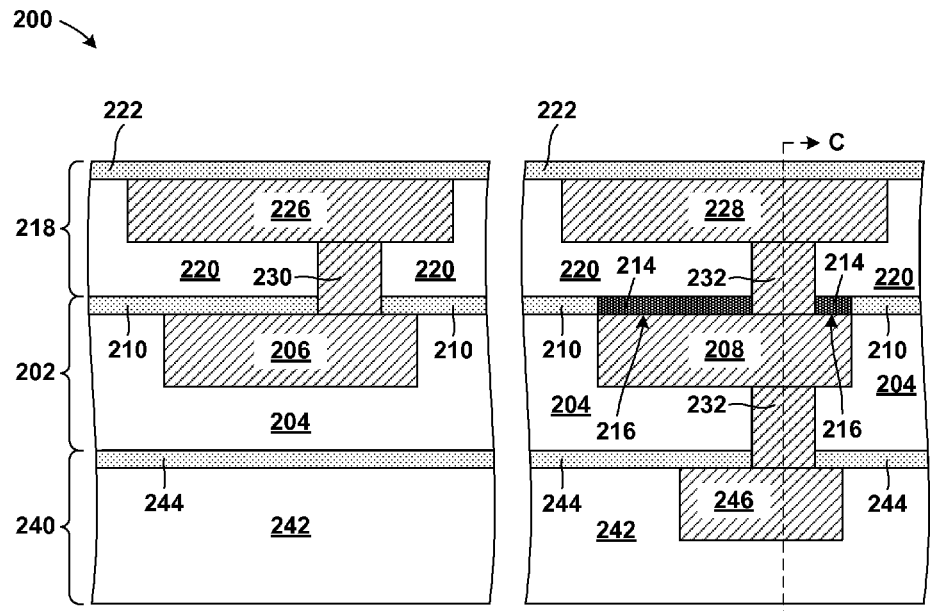
FIG. 10 depicts the final e-fuse structure according to another exemplary embodiment.
Figure 11:
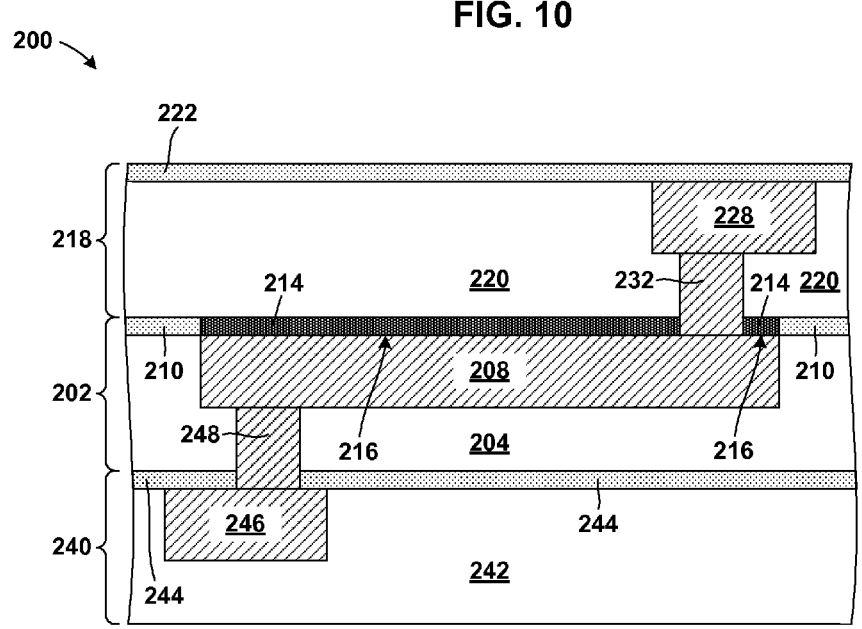
FIG. 11 depicts a cross section view, section C-C, of FIG. 10.

Referring now to FIGS. 10 and 11, an alternate e-fuse configuration is shown, in which the conductive connections to the fuse link 208 are positioned opposite each other, for example, one via may connect to the top of the fuse line 208 and another via may connect to the bottom of the fuse line 208. The present embodiment may include an $M_{x-1}$ level 240 located below the $M_x$ level 202. The $M_{x-1}$ level 240 may include an $M_{x-1}$ dielectric 242, an $M_{x-1}$ metal 246, and an $M_{x-1}$ cap dielectric 244. The elements of the $M_{x-1}$ level 240 may be substantially similar to like elements of the $M_x$ level 202, as described above. Furthermore, the $M_x$ level 202 may further include a fourth via 248 which may extend vertically and form a conductive link between the bottom of the fuse line 208 and the $M_{x-1}$ metal 246. In the present embodiment, the modified fuse cap 214 is located directly above the fuse line 208 as described in detail above.

Figure 12:
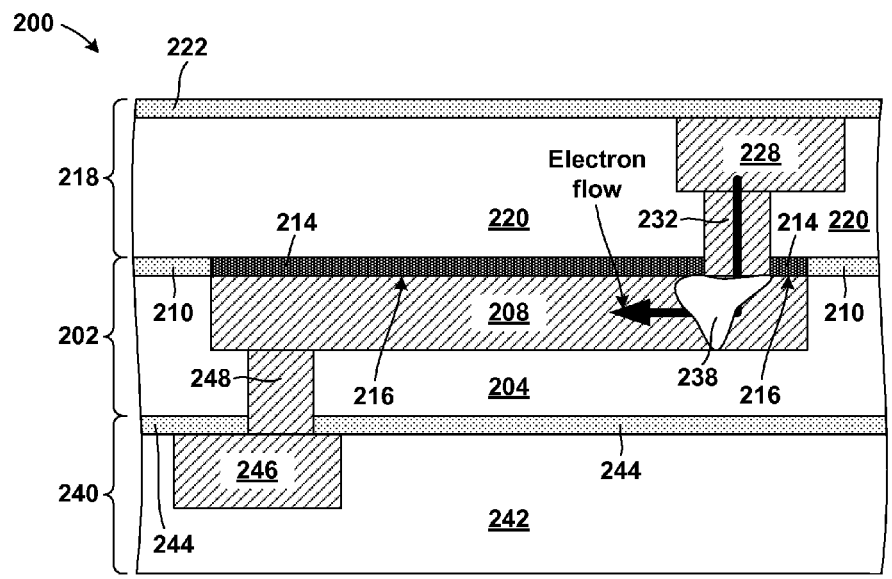
FIG. 12 depicts the cross section view, section C-C, of FIG. 10, after programming the e-fuse according to another exemplary embodiment.
Figure 13:
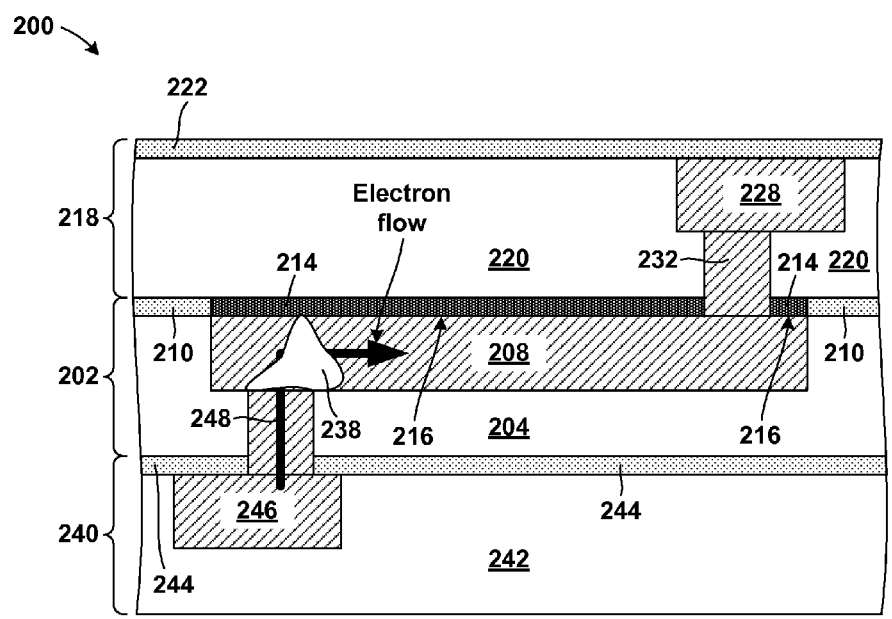
FIG. 13 depicts the cross section view, section C-C, of FIG. 10, after programming the e-fuse according to another exemplary embodiment.

Now referring to FIGS. 12 and 13, the final vertical e-fuse structure is shown after programming according to two alternative embodiments. In the two embodiments depicted in FIGS. 12 and 13 electrons, are flowing in opposite directions as indicated in the figures. The failure mode of each embodiment is substantially similar to that described above with reference to FIG. 9.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming an electronic fuse, the method comprising:
   forming an $M_x$ level comprising a fuse line, an $M_x$ dielectric, and an $M_x$ cap dielectric above of the fuse line and the $M_x$ dielectric;
   modifying a portion of the $M_x$ cap dielectric directly above the fuse line; and
   forming an $M_{x+1}$ level above the $M_x$ level, the $M_{x+1}$ level comprising a first $M_{x+1}$ metal and a first via electrically connecting the fuse line to the first $M_{x+1}$ metal.

2. The method of claim 1, wherein forming the $M_{x+1}$ level comprises a second $M_{x+1}$ metal and a second via electrically connecting the fuse line to the second $M_{x+1}$ metal.

3. The method of claim 1, further comprising:
   forming an $M_{x-1}$ level below the $M_x$ level, the $M_{x-1}$ level comprising an $M_{x-1}$ metal and a second via electrically connecting the fuse line to the $M_{x-1}$ metal.

4. The method of claim 1, wherein modifying the portion of the $M_x$ cap dielectric directly above the fuse line comprises:
   oxidizing the $M_x$ cap dielectric.

5. The method of claim 1, wherein modifying the portion of the $M_x$ cap dielectric directly above the fuse line comprises:
   oxidizing a portion of the fuse line.

6. The method of claim 1, wherein the $M_x$ cap dielectric comprises at least one of SiN, SiNH, SiC, SiCN, SiCH, or SiCNH.

7. The method of claim 1, wherein the $M_x$ cap dielectric comprises any oxidizable dielectric capping material, and the modified portion of the $M_x$ cap dielectric comprises the oxidizable dielectric capping material after being oxidized.

8. The method of claim 1, wherein the $M_x$ cap dielectric comprises SiCN, and the modified portion of the $M_x$ cap dielectric comprises SiCON.

* * * * *